United States Patent [19]

Ohno

[11] Patent Number: 4,949,160
[45] Date of Patent: Aug. 14, 1990

[54] SEMICONDUCTOR DEVICE

[75] Inventor: Jun-ichi Ohno, Yokohama, Japan

[73] Assignee: Kabushiki Kaisha Toshiba, Kawasaki, Japan

[21] Appl. No.: 285,021

[22] Filed: Dec. 16, 1988

[30] Foreign Application Priority Data

Dec. 17, 1987 [JP] Japan .................................. 62-319773

[51] Int. Cl.$^5$ ...................... H01L 23/48; H01L 23/50
[52] U.S. Cl. .......................................... 357/70; 357/68
[58] Field of Search ............................. 357/70, 68, 72; 174/52.4

[56] References Cited

U.S. PATENT DOCUMENTS 4,684,975 8/1987 Takiar et al. ........................... 357/70
4,721,993 1/1988 Walter .................................... 357/70

FOREIGN PATENT DOCUMENTS 56-40265 4/1981 Japan ..................................... 357/70
60-106158 6/1985 Japan .

OTHER PUBLICATIONS

Jul., 1984, Japanese Patent Abstract (Nippon), 59-129451, Lead Frame.
1985, Japanese Patent Abstract (Toshiba), 62-1239, Semiconductor Device.
1987, Technical Report of the Institute of Electronics, Information and Communication Engineers.
Toshiba Review Article, "ASIC Packaging Technology".
"Nikkei Microdevices", Nov. 1987, p. 32.
Nikkei Microdevices Publication of Dec. 1987, pp. 76-78.
Nikkei Electronics No. 434, Nov. 16, 1987.
Japanese Industrial Paper, Dec. 10, 1987.

Primary Examiner—Rolf Hille
Assistant Examiner—S. V. Clark
Attorney, Agent, or Firm—Foley & Lardner, Schwartz, Jeffery, Schwaab, Mack, Blumenthal & Evans

[57] ABSTRACT

A semiconductor device is provided with a plurality of inner leads substantially radially arranged around a pellet mounting area of a lead frame, an insulating sheet arranged on the pellet mounting area so as to adhesively fix inner lead tip portions, and a semiconductor pellet mounted on the insulating sheet, wherein each tip portion of at least every other inner lead is provided with a broader portion broader than the width of each of the other inner lead tip portions, the broader portion is positioned closer to the central portion of the lead frame than the other inner lead tip portions, and an opening or a thin portion is provided within the broader portion.

4 Claims, 3 Drawing Sheets

BACKGROUND ART

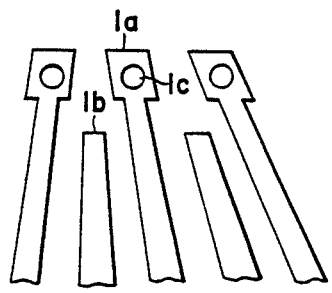
FIG. 5
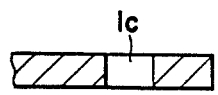    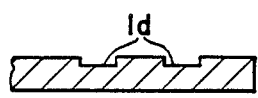
FIG. 6A    FIG. 6B    FIG. 6C
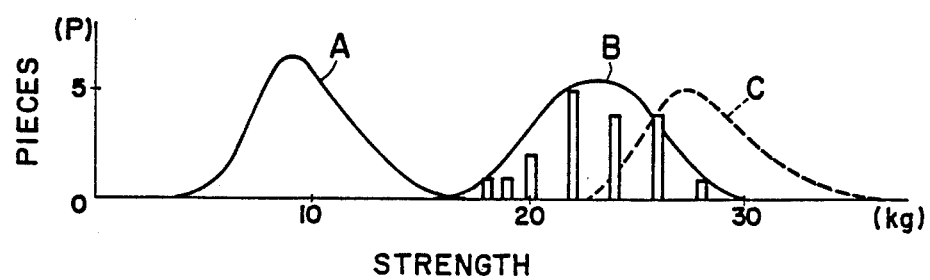
FIG. 7

SEMICONDUCTOR DEVICE

BACKGROUND OF THE INVENTION

This invention relates to a semiconductor device, and more particularly to a semiconductor device of the plastic mold type using a bedless lead frame.

Because plastic mold type semiconductor devices are easy to mass-produce and can be manufactured at a low cost, they have been widely used in recent years. Such semiconductor devices have been used also in large semiconductor devices having far more than 100 pins.

In conventional plastic mold type semiconductor devices, a lead frame having a bed portion for mounting a pellet is ordinarily used. However, the problems which occur in using the conventional lead frame are as follows: First tie bars for fixing the bed portion to the outer frame hinder the arrangement of the inner leads, resulting in a lowered area efficiency. Second is that the tie bars serve as a route for moisture to penetrate from the outside. Third is that a crack due to the difference between the coefficient of thermal expansion of the bed portion and that of the plastic resin for mold is likely to occur. Fourth is the troublesome design and the poor economic efficiency because the dimensions of the bed portion must be changed in conformity with the dimensions of the pellet used.

To overcome such problems, a bedless semiconductor device has been proposed. FIG. 1 shows a cross section of the bedless semiconductor device, wherein leads 15 extend closer to the vicinity of the center of the semiconductor device, when compared to those of the conventional one, and no bed portion is provided. An insulating sheet (tape) 16 is fixed onto substantially the central portion of the semiconductor device in a manner where it is supported by the leads 15. After a pellet 12 is subjected to die-bonding so that it is mounted on the insulating sheet 16, wire-bonding is implemented to connect the pellet 12 and the leads 15 by means of wires 13.

FIGS. 2A, 2B and 2C show how mounting using such bedless type lead frames are conducted. In FIG. 2B, a small pellet 12 is mounted on the central portion of the lead frame 20 shown in FIG. 2A through a small insulating sheet 16. On the other hand, in FIG. 2C, a pellet 12' larger than that in the case of FIG. 2B, is mounted on the same portion as the above through a large insulating sheet 16'.

FIG. 3 is a plan view in which the central portion of the bedless type lead frame shown in FIG. 2A is enlarged. A configuration is provided such that tip portions of respective inner leads 15a are substantially equidistant from the center of the lead frame.

A similar bedless type lead frame is also described in the Nikkei Microdevices, Dec. 1, 1987, Nikkei McGrow-Hill, pp. 76–78 and the Nikkei Electronics, Nov. 16, 1987, Nikkei McGrow-Hill, pp. 100–101.

When such a bedless type lead frame is employed, mounting of pellets of different sizes is enabled by using the same kind of lead frames. Thus, productive management is facilitated and costs can be reduced.

However, because a large number of inner leads are all directed toward the center of the lead frame as shown in FIG. 3 in the conventional bedless type lead frame, the tip portion of each inner lead becomes extremely thin, so that the ability to support the insulating sheet at the central portions of the lead frame is extremely reduced, leading to the problem of stable supporting becoming impossible.

SUMMARY OF THE INVENTION

Therefore, an object of this invention is to provide a semiconductor device capable of stably supporting an insulating sheet even at the central portion of a bedless lead frame.

In accordance with this invention, there is provided a semiconductor device comprising a plurality of inner leads substantially radially arranged around a pellet mounting portion, an insulating sheet arranged on the pellet mounting portion so as to adhesively fix inner lead tip portions and a semiconductor pellet mounted on the insulating sheet, in which each tip portion of at least every other inner lead is provided with a broader portion which is broader than the width of each of other inner lead tip portion, the tip portion of the broader portion is positioned closer to the central portion of the lead frame than other inner lead tip portions, and an opening or a thin portion is provided within the broader portion.

Since the inner lead tip portions of the lead frame are formed broader at least at every other inner lead and since an opening or a thin portion for improving adhesive property of the insulating sheet is provided in each broader portion, the broader portion increases the contact surface to the insulating sheet, and the opening, etc. improves the bonding strength. Accordingly, even when a large number of inner leads are provided, it is possible to stably and firmly support the insulating sheet. In addition, since many kinds of semiconductor devices can be manufactured using the same lead frame in accordance with this invention, economical efficiency is also improved.

BRIEF DESCRIPTION OF THE DRAWINGS

In the accompanying drawings:

FIG. 5 is an enlarged plan view of the inner lead tip portions shown in FIG. 4;

FIGS. 6A to 6C are cross sectional views showing the structure for increasing the bonding strength provided on the inner lead tip portion; and FIG. 7 is a graph showing the effect of this invention.

DESCRIPTION OF THE PREFERRED EMBODIMENT

Several embodiments according to this invention will be described in detail with reference to the drawings.

Figure 1:
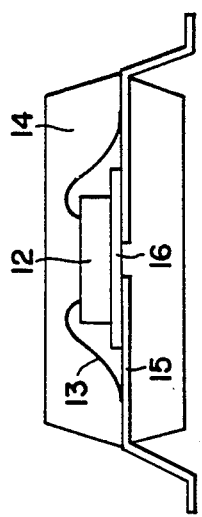
FIG. 1 is a cross sectional view showing the structure of a semiconductor device using a conventional bedless type lead frame.
Figure 2C:
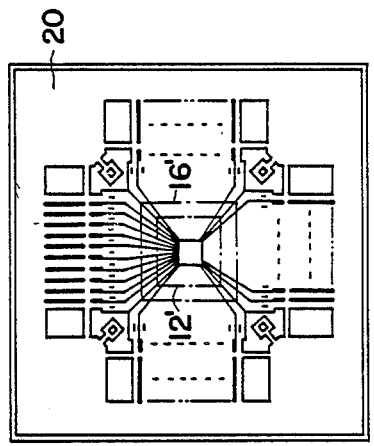
FIGS. 2A to 2C are plan views showing how pellets of different sizes are mounted using bedless type lead frames.
Figure 2B:
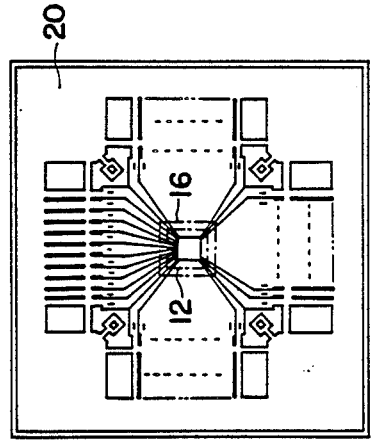
Figure 2A:
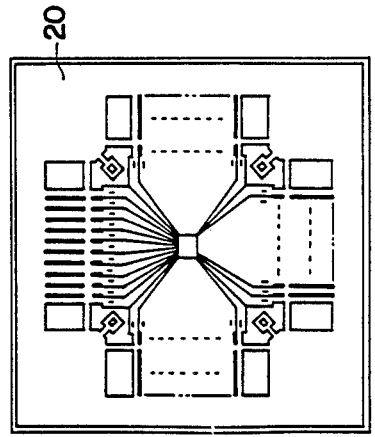
Figure 3:
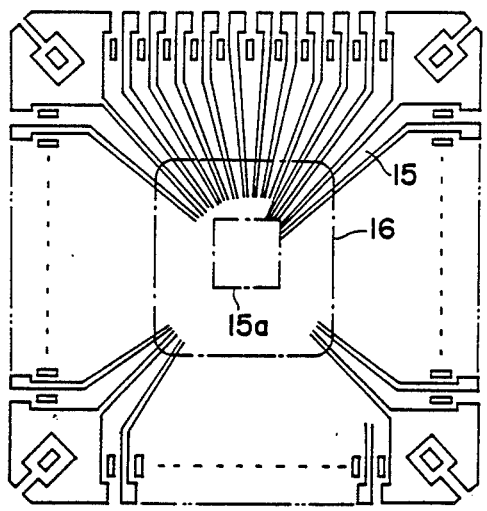
FIG. 3 is a plan view showing the central portion of a conventional bedless type lead frame.
Figure 4:
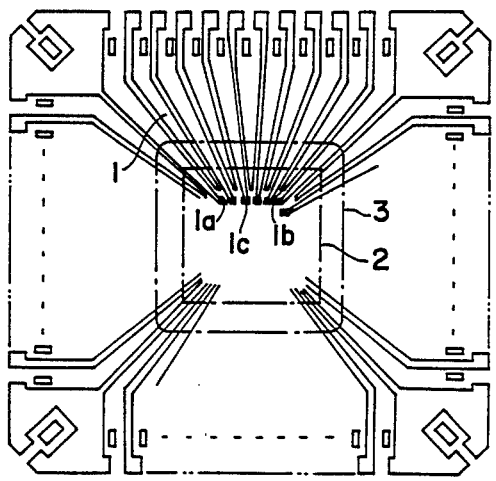
FIG. 4 is an enlarged plan view of the central portion of a lead frame used in a semiconductor device according to this invention.

FIG. 4 is an enlarged plan view showing a portion of a lead frame used for a semiconductor device according to an embodiment of this invention.

In accordance with this figure, in the same manner as in the conventional semiconductor device using a bedless leadframe, inner leads 1 extend up to the portion in the vicinity of the central portion of the semiconductor device, and no bed portion is provided. Inner leads 1 under the insulating sheet 3 on which the pellet 2 is mounted as indicated by single-dotted lines are constructed as understood from FIG. 5 which is a plan view having an expansion rate greater than that of FIG. 4 in a manner that, e.g., the tip portion 1a of one inner lead and the tip portion 1b of the adjacent inner lead are different in the width and the position, i.e., the tip portion 1a is broader than the tip portion 1b and is positioned closer to the central portion of the lead frame than the latter. In addition, a circular opening 1c is provided in the broader tip portion 1a. The cross section of the opening 1c is shown in FIG. 6A.

By employing such a configuration, when an insulating sheet is mounted on the lead frame, the broader portion 1a supports the insulating sheet at a position closer to the center of the lead frame and over a broad area, and bonding material is inserted into the opening 1c in bonding the insulating sheet, thus improving the bonding strength of the insulating sheet.

It is to be noted that it is required for such an insulating sheet to have a heat resistance property to tolerate temperatures of 160 to 180° C. for 1 to 5 minutes which is the heat condition at the time of plastic molding, as well as to have an excellent moisture resisting property, and to also have a coefficient of thermal expansion after plastic-molding, which is approximate to those of the inner leads and the pellet. Polyimide resin sheet is ordinarily used as the material satisfying these conditions. For the other material, a paper into which thermosetting resin such as epoxy resin is impregnated may be also used.

For a method for improving the bonding strength of the insulating sheet, as shown in FIG. 6B, half-etching using an etchant may be also implemented onto the surface of the insulating sheet to form a thin portion 1d.

FIG. 7 is a graph showing the effect obtained with this invention using a flat package of 44 pins wherein curve A shows the friction strength of the insulating sheet in the case of using a conventional lead frame, curve B shows the stripping strength of the insulating sheet in the case of using a lead frame having a tip formed as shown in FIG. 4 and including no opening, and curve C shows the stripping strength in the case of a lead frame having an opening shown in FIG. 6A. From this graph, it is seen that the bonding strength is considerably increased by the implementation of this invention.

While a single opening in FIG. 6A or a single half-etching portion in FIG. 6B is provided in the inner lead in the above-described embodiment, it may be provided in each lead. FIG. 6C shows the example where two half-etching portions 1d are provided in one lead.

Furthermore, while broader lead tip portions are provided at every other lead in the above-described embodiment, they may be provided at intervals of two leads or more. In addition, the arrangement density of broader lead tip portions may be changed depending upon places within the lead frame.

What is claimed is:

1. A semiconductor device comprising:
   a semiconductor pellet,
   insulating sheet means for mounting said semiconductor pellet thereon; and
   a plurality of inner leads for supporting said sheet means and for electrically connecting to said semiconductor pellet, said inner leads being substantially radially arranged around a pellet mounting area of said sheet means, the tip portions of at least every other inner lead being provided with a portion which is broader than the tip portions of remaining inner leads;
   said broad portion being positioned closer to the central portion of said sheet means than the tip portions of the remaining inner leads, the broad portions having means for strengthening an adhesive force acting between said insulating sheet means and said broad portions of the inner leads.

2. A semiconductor device according to claim 1, wherein said means for strengthening the adhesive force is an opening provided within said broad portion.

3. A semiconductor device according to claim 1, wherein said means for strengthening adhesive force is a thin portion provided within said broad portion.

4. A semiconductor device according to claim 1, wherein said sheet means is a polyamide.

* * * * *